(12) United States Patent
Yang

(10) Patent No.: US 10,798,822 B2
(45) Date of Patent: Oct. 6, 2020

(54) METHOD OF MANUFACTURING A COMPONENT EMBEDDED PACKAGE CARRIER

(71) Applicant: Subtron Technology Co., Ltd., Hsinchu County (TW)

(72) Inventor: Jing-Cyuan Yang, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 15/890,373

(22) Filed: Feb. 7, 2018

(65) Prior Publication Data

US 2018/0352658 A1 Dec. 6, 2018

(30) Foreign Application Priority Data

Jun. 2, 2017 (TW) .............................. 106118292 A

(51) Int. Cl.
*H05K 1/18* (2006.01)
*H01L 23/00* (2006.01)
(Continued)

(52) U.S. Cl.
CPC ............ *H05K 1/185* (2013.01); *H01L 21/486* (2013.01); *H01L 21/4857* (2013.01);
(Continued)

(58) Field of Classification Search
CPC ........ H05K 1/185; H05K 1/115; H05K 3/288; H05K 3/32; H05K 3/429; H05K 3/4602;
(Continued)

(56) References Cited

U.S. PATENT DOCUMENTS

2008/0123308 A1 5/2008 Ryu et al.
2009/0249618 A1* 10/2009 Wang .................. H01L 23/5389
29/829
(Continued)

FOREIGN PATENT DOCUMENTS

CN 103517553 1/2014
CN 105140198 12/2015
(Continued)

OTHER PUBLICATIONS

"Office Action of Taiwan Counterpart Application", dated Apr. 11, 2018, p. 1-p. 4, in which the listed reference was cited.
(Continued)

*Primary Examiner* — Peter Dungba Vo
*Assistant Examiner* — Jeffrey T Carley
(74) *Attorney, Agent, or Firm* — JCIPRNET

(57) ABSTRACT

A manufacturing method of a component embedded package carrier includes the following steps: providing the dielectric layer; a first copper foil layer and a second copper foil layer; forming a plurality of through holes; forming a conductive material layer on the first copper foil layer and the second copper foil layer; patterning the conductive material layer, the first copper foil layer and the second copper foil layer, thereby defining the conductive through hole structures, the first patterned conductive layer and the second patterned conductive layer and forming the core layer comprises; disposing at least one electronic component inside the opening of the core layer; laminating a first insulating layer and a first circuit layer located on the first insulating layer onto the first patterned conductive layer; laminating a second insulating layer and a second circuit layer located on the second insulating layer onto the second patterned conductive layer.

5 Claims, 11 Drawing Sheets

(51) Int. Cl.
*H01L 23/498* (2006.01)
*H01L 23/538* (2006.01)
*H05K 3/32* (2006.01)
*H05K 3/28* (2006.01)
*H05K 1/11* (2006.01)
*H01L 21/48* (2006.01)
*H05K 3/46* (2006.01)
*H05K 3/42* (2006.01)
*H01L 21/56* (2006.01)
*H01L 21/683* (2006.01)
*H05K 3/00* (2006.01)

(52) U.S. Cl.
CPC ............ *H01L 21/56* (2013.01); *H01L 21/561* (2013.01); *H01L 21/6835* (2013.01); *H01L 23/49822* (2013.01); *H01L 23/49827* (2013.01); *H01L 23/49833* (2013.01); *H01L 23/49838* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/24* (2013.01); *H01L 24/25* (2013.01); *H05K 1/115* (2013.01); *H05K 3/288* (2013.01); *H05K 3/32* (2013.01); *H05K 3/429* (2013.01); *H05K 3/4602* (2013.01); *H05K 3/4652* (2013.01); *H05K 3/4694* (2013.01); *H01L 21/568* (2013.01); *H01L 2221/68345* (2013.01); *H01L 2221/68359* (2013.01); *H01L 2221/68381* (2013.01); *H01L 2224/24155* (2013.01); *H01L 2224/2518* (2013.01); *H01L 2224/82005* (2013.01); *H01L 2924/1304* (2013.01); *H01L 2924/19041* (2013.01); *H01L 2924/19042* (2013.01); *H01L 2924/19043* (2013.01); *H01L 2924/19102* (2013.01); *H05K 3/007* (2013.01); *H05K 3/0026* (2013.01); *H05K 3/0047* (2013.01); *H05K 3/423* (2013.01); *H05K 2201/0187* (2013.01); *H05K 2201/045* (2013.01); *H05K 2201/09036* (2013.01); *H05K 2201/09045* (2013.01); *H05K 2201/09509* (2013.01); *H05K 2201/09536* (2013.01); *H05K 2201/1003* (2013.01); *H05K 2201/10015* (2013.01); *H05K 2201/10022* (2013.01); *H05K 2201/10166* (2013.01); *H05K 2201/10568* (2013.01); *H05K 2203/0165* (2013.01); *H05K 2203/065* (2013.01); *H05K 2203/107* (2013.01); *H05K 2203/1469* (2013.01)

(58) Field of Classification Search
CPC .. H05K 3/4652; H05K 3/4694; H01L 21/486; H01L 21/56; H01L 21/4857; H01L 2221/68345; H01L 2221/68359; H01L 2221/68381
See application file for complete search history.

(56) References Cited

U.S. PATENT DOCUMENTS

| | | | |
|---|---|---|---|
| 2009/0280617 A1* | 11/2009 | Cheng | H05K 1/167 438/386 |
| 2009/0314650 A1* | 12/2009 | Tseng | H01L 21/486 205/205 |
| 2010/0006330 A1* | 1/2010 | Fu | H01L 21/486 174/260 |
| 2010/0320593 A1* | 12/2010 | Weng | H01L 23/13 257/693 |
| 2011/0024916 A1 | 2/2011 | Marimuthu et al. | |
| 2011/0154658 A1* | 6/2011 | Chuang | H05K 3/0097 29/829 |
| 2011/0278713 A1* | 11/2011 | Appelt | H01L 21/563 257/687 |
| 2012/0033394 A1* | 2/2012 | Su | H05K 1/186 361/771 |
| 2012/0153493 A1* | 6/2012 | Lee | H01L 25/16 257/774 |
| 2013/0269986 A1* | 10/2013 | Sun | H01L 23/3677 174/252 |
| 2014/0146504 A1* | 5/2014 | Hu | H05K 3/007 361/767 |
| 2014/0317907 A1* | 10/2014 | Sun | H01L 23/13 29/592.1 |
| 2015/0084206 A1 | 3/2015 | Lin | |
| 2015/0348931 A1* | 12/2015 | Lee | H01L 23/49838 257/774 |
| 2016/0150651 A1* | 5/2016 | Tsai | H05K 1/186 174/251 |
| 2016/0163614 A1* | 6/2016 | Chen | H01L 25/50 257/774 |
| 2016/0219714 A1* | 7/2016 | Hsu | H01L 23/49827 |
| 2018/0102311 A1* | 4/2018 | Shih | H01L 24/16 |

FOREIGN PATENT DOCUMENTS

| | | |
|---|---|---|
| CN | 105990157 | 10/2016 |
| CN | 106653703 | 5/2017 |
| TW | 201019438 | 5/2010 |
| TW | 201427527 | 7/2014 |

OTHER PUBLICATIONS

"Office Action of China Counterpart Application," dated Nov. 27, 2019, p. 1-p. 10.

* cited by examiner

METHOD OF MANUFACTURING A COMPONENT EMBEDDED PACKAGE CARRIER

CROSS-REFERENCE TO RELATED APPLICATION

This application claims the priority benefit of Taiwan application serial no. 106118292, filed on Jun. 2, 2017. The entirety of the above-mentioned patent application is hereby incorporated by reference herein and made a part of this specification.

BACKGROUND OF THE INVENTION

Field of the Invention

The invention relates to a package carrier and a manufacturing method thereof. More particularly, the invention relates to a component embedded package carrier and a manufacturing method thereof.

Description of Related Art

In recent years, with progress of electronic techniques and advancement of high-tech electronic industry, electronic products having higher processing speed, multiple functions, higher density, smaller size, lighter weight and lower price have been continuously launched. In these electronic products, a package carrier is generally disposed. This package carrier, in addition to including a conductive circuit, carries electronic components such as a capacitor, an inductor, a resistor or an integrated circuit (IC) chip so as to serve as a data processing unit of the electronic products. However, if the electronic components are all disposed on the package carrier, problems such as an increase in carrier area and a reduction in layout space are likely to arise. Moreover, the market requirements of smaller size and lighter weight for electronic products cannot be satisfied. Therefore, how to embed an electronic component in a package carrier to reduce thickness of the package carrier and to increase layout space has become one of the topics receiving attention from designers in research and development.

SUMMARY OF THE INVENTION

The invention provides a component embedded package carrier having a smaller package thickness.

The invention further provides a manufacturing method of a component embedded package carrier, the manufacturing method being configured to manufacture the component embedded package carrier as described above.

The component embedded package carrier of the invention includes a core layer, at least one electronic component, a first insulating layer, a second insulating layer, a third patterned conductive layer, a fourth patterned conductive layer, a plurality of conductive blind via structures, a first protecting layer and a second protecting layer. The core layer includes a dielectric layer, an opening, a first patterned conductive layer, a second patterned conductive layer and a plurality of conductive through hole structures. The dielectric layer has an upper surface and a lower surface opposite each other. The opening passes through the dielectric layer. The first patterned conductive layer is located on the upper surface, and the second patterned conductive layer is located on the lower surface. The conductive through hole structures pass through the dielectric layer and connect the first patterned conductive layer with the second patterned conductive layer. The electronic component is disposed inside the opening of the core layer. The first insulating layer covers the first patterned conductive layer and the upper surface of the dielectric layer and is filled into the opening. The second insulating layer covers the second patterned conductive layer and the lower surface of the dielectric layer and is filled into the opening. The first insulating layer and the second insulating layer completely fill the opening and completely encapsulate the electronic component. The third patterned conductive layer is disposed on the first insulating layer. The fourth patterned conductive layer is disposed on the second insulating layer. The conductive blind via structures connect the third patterned conductive layer with the conductive through hole structures, the fourth patterned conductive layer with the conductive through hole structures, the third patterned conductive layer with the electronic component and the fourth patterned conductive layer with the electronic component. The first protecting layer covers the third patterned conductive layer and a portion of the first insulating layer, and has a first roughness surface. The second protecting layer covers the fourth patterned conductive layer and a portion of the second insulating layer, and has a second roughness surface.

In an embodiment of the invention, roughness of the first roughness surface is between 1 μm to 5 μm.

In an embodiment of the invention, roughness of the second roughness surface is between 1 μm to 5 μm.

In an embodiment of the invention, the electronic component includes an active component or a passive component.

The manufacturing method of a component embedded package carrier of the invention includes the following steps. A core layer is formed, the core layer including a dielectric layer, an opening, a first patterned conductive layer, a second patterned conductive layer and a plurality of conductive through hole structures. The dielectric layer has an upper surface and a lower surface opposite each other. The opening passes through the dielectric layer. The first patterned conductive layer is located on the upper surface, and the second patterned conductive layer is located on the lower surface. The conductive through hole structures pass through the dielectric layer and connect the first patterned conductive layer with the second patterned conductive layer. At least one electronic component is disposed inside the opening of the core layer. A first insulating layer and a first circuit layer located on the first insulating layer are laminated onto the first patterned conductive layer, wherein the first insulating layer covers the first patterned conductive layer and the upper surface of the dielectric layer and is filled into the opening. A second insulating layer and a second circuit layer located on the second insulating layer are laminated onto the second patterned conductive layer, wherein the second insulating layer covers the second patterned conductive layer and the lower surface of the dielectric layer and is filled into the opening. The first insulating layer and the second insulating layer completely fill the opening and completely encapsulate the electronic component. A plurality of conductive blind via structures, a third patterned conductive layer and a fourth patterned conductive layer are formed. The third patterned conductive layer is located on the first insulating layer and includes the first circuit layer, and the fourth patterned conductive layer is located on the second insulating layer and includes the second circuit layer. The conductive blind via structures connect the third patterned conductive layer with the conductive through hole structures, the fourth patterned conductive layer with the conductive through hole structures, the third patterned conductive layer with the electronic component and the fourth patterned conductive layer with the electronic component. A first protecting layer and a second protecting layer are formed. The first protecting layer has a first roughness surface and covers the third patterned conductive layer and a portion of the first insulating layer. The second protecting layer has a second roughness surface and covers the fourth patterned conductive layer and a portion of the second insulating layer.

In an embodiment of the invention, the step of forming the core layer includes the following. The dielectric layer, a first copper foil layer and a second copper foil layer are provided. The first copper foil layer is disposed on the upper surface of the dielectric layer, and the second copper foil layer is disposed on the lower surface of the dielectric layer. A plurality of through holes are formed, the through holes passing through the dielectric layer, the first copper foil layer and the second copper foil layer. A conductive material layer is formed on the first copper foil layer and the second copper foil layer, wherein the conductive material layer fills the through holes and covers the first copper foil layer and the second copper foil layer. The conductive material layer, the first copper foil layer and the second copper foil layer are patterned, thereby defining the conductive through hole structures, the first patterned conductive layer and the second patterned conductive layer. After the conductive material layer, the first copper foil layer and the second copper foil layer are patterned, the opening is formed.

In an embodiment of the invention, the manufacturing method of a component embedded package carrier further includes the following. After the core layer is formed and before the electronic component is disposed, a support is provided to contact the second patterned conductive layer. After the first insulating layer and the first circuit layer located on the first insulating layer are laminated onto the first patterned conductive layer and before the second insulating layer and the second circuit layer located on the second insulating layer are laminated onto the second patterned conductive layer, the support is removed to expose the second patterned conductive layer.

In an embodiment of the invention, the step of forming the conductive blind via structures, the third patterned conductive layer and the fourth patterned conductive layer includes the following. A plurality of blind vias are formed, the blind vias extending from the first circuit layer to the first patterned conductive layer and the electronic component and extending from the second circuit layer to the second patterned conductive layer and the electronic component. A conductive material layer is formed on the first circuit layer and the second circuit layer, wherein the conductive material layer fills the blind vias and covers the first circuit layer and the second circuit layer. The conductive material layer, the first circuit layer and the second circuit layer are patterned, thereby defining the conductive blind via structures, the third patterned conductive layer and the fourth patterned conductive layer.

In an embodiment of the invention, roughness of the first roughness surface is between 1 μm to 5 μm.

In an embodiment of the invention, roughness of the second roughness surface is between 1 μm to 5 μm.

In an embodiment of the invention, the electronic component includes an active component or a passive component.

In an embodiment of the invention, an unit embedded package carrier includes a component embedded package unit, a carrier, a third insulating layer, a fourth insulating layer, a fifth patterned conductive layer, a sixth patterned conductive layer and a plurality of conductive connection structures. The component embedded package unit includes a component embedded layer, a first protecting layer and a second protecting layer. The carrier has a containing opening, and the component embedded package unit is disposed inside the containing opening. The third insulating layer covers the first protecting layer and the carrier and is filled into the containing opening. The fourth insulating layer covers the second protecting layer and the carrier and is filled into the containing opening, wherein the third insulating layer and the fourth insulating layer completely fill the containing opening and completely encapsulate the component embedded package unit. The fifth patterned conductive layer is disposed on the third insulating layer. The sixth patterned conductive layer is disposed on the fourth insulating layer. The conductive connection structures connect the fifth patterned conductive layer with the component embedded layer, the sixth patterned conductive layer with the component embedded layer, the fifth patterned conductive layer with the carrier and the sixth patterned conductive layer with the carrier.

In an embodiment of the invention, the component embedded layer includes a core layer, at least one electronic component, a first insulating layer, a second insulating layer, a third patterned conductive layer, a fourth patterned conductive layer and a plurality of conductive blind via structures. The core layer includes a dielectric layer, an opening, a first patterned conductive layer, a second patterned conductive layer and a plurality of conductive through hole structures. The dielectric layer has an upper surface and a lower surface opposite each other. The opening passes through the dielectric layer. The first patterned conductive layer is located on the upper surface, and the second patterned conductive layer is located on the lower surface. The conductive through hole structures pass through the dielectric layer and connect the first patterned conductive layer with the second patterned conductive layer. The electronic component is disposed inside the opening of the core layer. The first insulating layer covers the first patterned conductive layer and the upper surface of the dielectric layer and is filled into the opening. The second insulating layer covers the second patterned conductive layer and the lower surface of the dielectric layer and is filled into the opening. The first insulating layer and the second insulating layer completely fill the opening and completely encapsulate the electronic component. The third patterned conductive layer is disposed on the first insulating layer. The fourth patterned conductive layer is disposed on the second insulating layer. The conductive blind via structures connect the third patterned conductive layer with the conductive through hole structures, the fourth patterned conductive layer with the conductive through hole structures, the third patterned conductive layer with the electronic component and the fourth patterned conductive layer with the electronic component. The first protecting layer covers the third patterned conductive layer and a portion of the first insulating layer, and has a first roughness surface. The second protecting layer covers the fourth patterned conductive layer and a portion of the second insulating layer, and has a second roughness surface.

In an embodiment of the invention, roughness of the first roughness surface is between 1 μm to 5 μm.

In an embodiment of the invention, roughness of the second roughness surface is between 1 μm to 5 μm.

In an embodiment of the invention, the electronic component includes an active component or a passive component.

The manufacturing method of an unit embedded package carrier of the invention includes the following steps. A carrier is provided having a containing opening. A component embedded package unit is disposed inside the containing opening of the carrier, wherein the component embedded package unit includes a component embedded layer, a first protecting layer and a second protecting layer. A third insulating layer and a third circuit layer located thereon are laminated onto the first protecting layer, wherein the third insulating layer covers the first protecting layer and the carrier and is filled into the containing opening. A fourth insulating layer and a fourth circuit layer located thereon are laminated onto the second protecting layer, wherein the fourth insulating layer covers the second protecting layer and the carrier and is filled into the containing opening. The third insulating layer and the fourth insulating layer completely fill the containing opening and completely encapsulate the component embedded package unit. A plurality of conductive connection structures, a fifth patterned conductive layer and a sixth patterned conductive layer are formed. The fifth patterned conductive layer is located on the third insulating layer. The sixth patterned conductive layer is located on the fourth insulating layer. The conductive connection structures connect the fifth patterned conductive layer with the component embedded layer, the sixth patterned conductive layer with the component embedded layer, the fifth patterned conductive layer with the carrier and the sixth patterned conductive layer with the carrier.

In an embodiment of the invention, a method of forming the component embedded layer includes the following. A core layer is formed, the core layer including a dielectric layer, an opening, a first patterned conductive layer, a second patterned conductive layer and a plurality of conductive through hole structures. The dielectric layer has an upper surface and a lower surface opposite each other. The opening passes through the dielectric layer. The first patterned conductive layer is located on the upper surface, and the second patterned conductive layer is located on the lower surface. The conductive through hole structures pass through the dielectric layer and connect the first patterned conductive layer with the second patterned conductive layer. At least one electronic component is disposed inside the opening of the core layer. A first insulating layer and a first circuit layer located on the first insulating layer are laminated onto the first patterned conductive layer, wherein the first insulating layer covers the first patterned conductive layer and the upper surface of the dielectric layer and is filled into the opening. A second insulating layer and a second circuit layer located on the second insulating layer are laminated onto the second patterned conductive layer, wherein the second insulating layer covers the second patterned conductive layer and the lower surface of the dielectric layer and is filled into the opening. The first insulating layer and the second insulating layer completely fill the opening and completely encapsulate the electronic component. A plurality of conductive blind via structures, a third patterned conductive layer and a fourth patterned conductive layer are formed. The third patterned conductive layer is located on the first insulating layer and includes the first circuit layer, and the fourth patterned conductive layer is located on the second insulating layer and includes the second circuit layer. The conductive blind via structures connect the third patterned conductive layer with the conductive through hole structures, the fourth patterned conductive layer with the conductive through hole structures, the third patterned conductive layer with the electronic component and the fourth patterned conductive layer with the electronic component. A first protecting layer and a second protecting layer are formed. The first protecting layer has a first roughness surface and covers the third patterned conductive layer and a portion of the first insulating layer. The second protecting layer has a second roughness surface and covers the fourth patterned conductive layer and a portion of the second insulating layer. The core layer, the electronic component, the first insulating layer, the second insulating layer, the conductive blind via structures, the third patterned conductive layer, the fourth patterned conductive layer, the first protecting layer and the second protecting layer define the component embedded package unit.

In an embodiment of the invention, roughness of the first roughness surface is between 1 μm to 5 μm.

In an embodiment of the invention, roughness of the second roughness surface is between 1 μm to 5 μm.

In an embodiment of the invention, the electronic component includes an active component or a passive component.

Based on the above, the component embedded package carrier of the invention has the electronic component or the component embedded package unit embedded therein. Therefore, the component embedded package carrier not only has a smaller package thickness, but is also improved in performance by the electronic component or the component embedded package unit.

To make the above features and advantages of the invention more comprehensible, embodiments accompanied with drawings are described in detail as follows.

DETAILED DESCRIPTION OF DISCLOSED EMBODIMENTS

Figure 1:
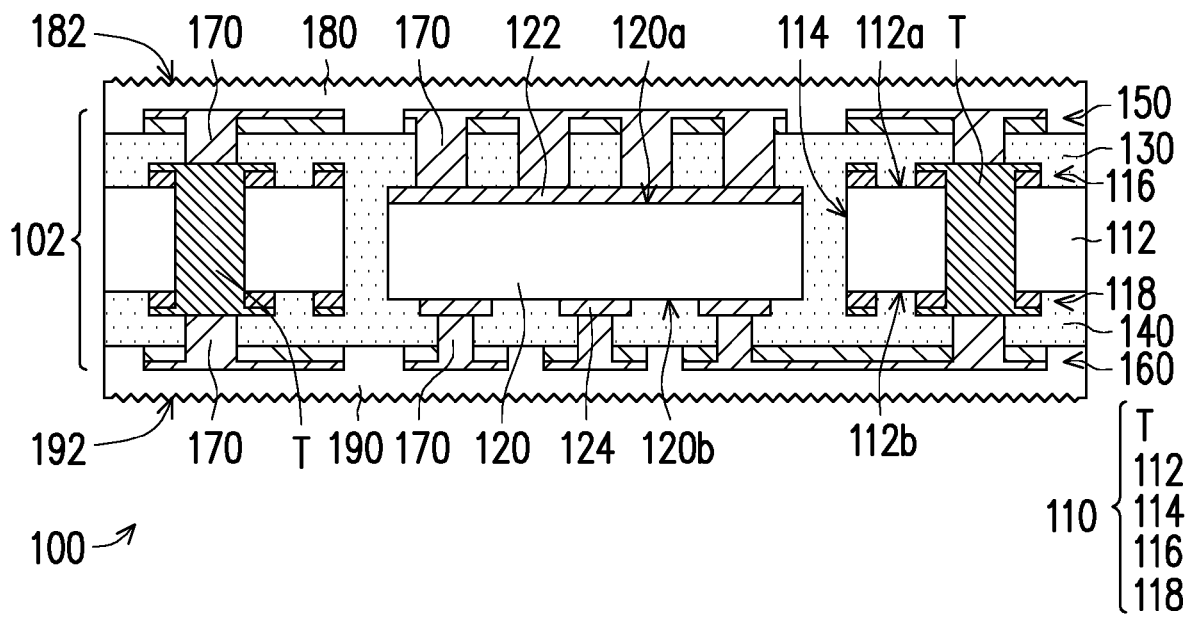
FIG. 1 illustrates a cross-sectional schematic view of a component embedded package carrier according to an embodiment of the invention.

FIG. 1 illustrates a cross-sectional schematic view of a component embedded package carrier according to an embodiment of the invention. Referring to FIG. 1, in the present embodiment, a component embedded package carrier 100 includes a component embedded layer 102, a first protecting layer 180 and a second protecting layer 190, wherein the component embedded layer 102 includes a core layer 110, at least one electronic component 120 (only one is schematically depicted in FIG. 1), a first insulating layer 130, a second insulating layer 140, a third patterned conductive layer 150, a fourth patterned conductive layer 160 and a plurality of conductive blind via structures 170.

In detail, the core layer 110 of the present embodiment includes a dielectric layer 112, an opening 114, a first patterned conductive layer 116, a second patterned conductive layer 118 and a plurality of conductive through hole structures T. The dielectric layer 112 has an upper surface 112a and a lower surface 112b opposite each other. The opening 114 is a through opening, passing through the dielectric layer 112. The first patterned conductive layer 116 is located on the upper surface 112a of the dielectric layer 112, and the second patterned conductive layer 118 is located on the lower surface 112b of the dielectric layer 112. The conductive through hole structures T pass through the dielectric layer 112 and connect the first patterned conductive layer 116 with the second patterned conductive layer 118.

The electronic component 120 is disposed inside the opening 114 of the core layer 110, wherein the electronic component 120 is, for example, an active component such as a transistor, or a passive component such as a resistor, a capacitor or an inductor. As shown in FIG. 1, the electronic component 120 has a top surface 120a and a bottom surface 120b opposite each other, a first electrode pad 122 and a plurality of second electrode pads 124, wherein the first electrode pad 122 is disposed on the top surface 120a and the second electrode pads 124 are disposed on the bottom surface 120b. Of course, in other embodiments not illustrated, the number of the electronic component 120 may be plural, and the plurality of electronic components 120 may be active components, passive components, or a combination of active components and passive components. Moreover, in other embodiments not illustrated, the electronic component 120 may have an electrode pad disposed on only one surface (either the top surface 120a or the bottom surface 120b) thereof, wherein the number of the electrode pad is not limited to one or plural.

Referring again to FIG. 1, the first insulating layer 130 of the present embodiment covers the first patterned conductive layer 116 and the upper surface 112a of the dielectric layer 112 and is filled into the opening 114. The second insulating layer 140 covers the second patterned conductive layer 118 and the lower surface 112b of the dielectric layer 112 and is filled into the opening 114. The first insulating layer 130 and the second insulating layer 140 completely fill the opening 114 and completely encapsulate the electronic component 120. The third patterned conductive layer 150 is disposed on the first insulating layer 130, and the fourth patterned conductive layer 160 is disposed on the second insulating layer 140. The conductive blind via structures 170 connect the third patterned conductive layer 150 with the conductive through hole structures T, the fourth patterned conductive layer 160 with the conductive through hole structures T, the third patterned conductive layer 150 with the first electrode pad 122 of the electronic component 120, and the fourth patterned conductive layer 160 with the second electrode pads 124 of the electronic component 120. That is, in the present embodiment, by the conductive blind via structures 170, the third patterned conductive layer 150 is structurally and electrically connected with the conductive through hole structures T, the fourth patterned conductive layer 160 is structurally and electrically connected with the conductive through hole structures T, the third patterned conductive layer 150 is structurally and electrically connected with the first electrode pad 122 of the electronic component 120, and the fourth patterned conductive layer 160 is structurally and electrically connected with the second electrode pads 124 of the electronic component 120.

Particularly, in the present embodiment, the first protecting layer 180 covers the third patterned conductive layer 150 and a portion of the first insulating layer 130. Moreover, the first protecting layer 180 has a first roughness surface 182, wherein roughness of the first roughness surface 182 is, for example, between 1 μm and 5 μm, and ten-point average roughness (Rz) of the first roughness surface 182 is, for example, between 1 μm and 5 μm. The second protecting layer 190 covers the fourth patterned conductive layer 160 and a portion of the second insulating layer 140. Moreover, the second protecting layer 190 has a second roughness surface 192, wherein roughness of the second roughness surface 192 is, for example, between 1 μm and 5 μm, and ten-point average roughness (Rz) of the second roughness surface 192 is, for example, between 1 μm and 5 μm. Herein, the first protecting layer 180 and the second protecting layer 190 have characteristics such as acid and alkali resistance and washability, thus effectively protecting the third patterned conductive layer 150, the fourth patterned conductive layer 160, the first insulating layer 130 and the second insulating layer 140.

The component embedded package carrier 100 of the present embodiment has the electronic component 120 embedded therein. Therefore, compared to the prior art in which the electronic component is disposed on the package carrier, the component embedded package carrier 100 of the present embodiment not only has a smaller package thickness, but is also improved in performance by the embedded electronic component 120.

The above has only described the structure of the component embedded package carrier 100 of the invention and has not described a manufacturing method of the component embedded package carrier 100 of the invention. With respect to this, a manufacturing process of the component embedded package carrier 100 of the invention will be explained in detail using the structure of the component embedded package carrier 100 shown in FIG. 1 as an example and with reference to FIG. 2A to FIG. 2M.

Figure 2A:
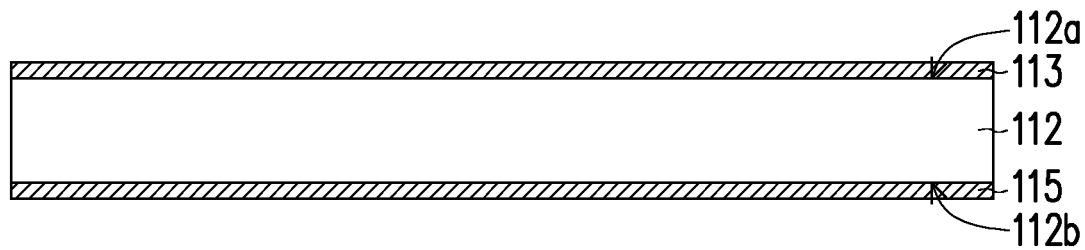
FIG. 2A to FIG. 2M illustrate cross-sectional schematic views of a manufacturing method of a component embedded package carrier according to an embodiment of the invention.

FIG. 2A to FIG. 2M illustrate cross-sectional schematic views of a manufacturing method of a component embedded package carrier according to an embodiment of the invention. Referring first to FIG. 2A, according to the manufacturing process of the component embedded package carrier 100 of the present embodiment, first of all, the dielectric layer 112, a first copper foil layer 113 and a second copper foil layer 115 are provided. The first copper foil layer 113 is disposed on the upper surface 112a of the dielectric layer 112 and completely covers the upper surface 112a, and the second copper foil layer 115 is disposed on the lower surface 112b of the dielectric layer 112 and completely covers the lower surface 112b.

Figure 2B:
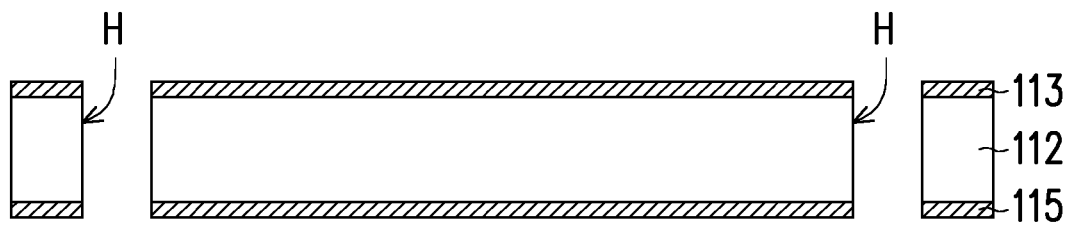

Next, referring to FIG. 2B, a plurality of through holes H are formed, wherein the through holes H pass through the dielectric layer 112, the first copper foil layer 113 and the second copper foil layer 115. Herein, a method of forming the through holes H is, for example but not limited to, mechanical drilling or laser drilling.

Figure 2C:
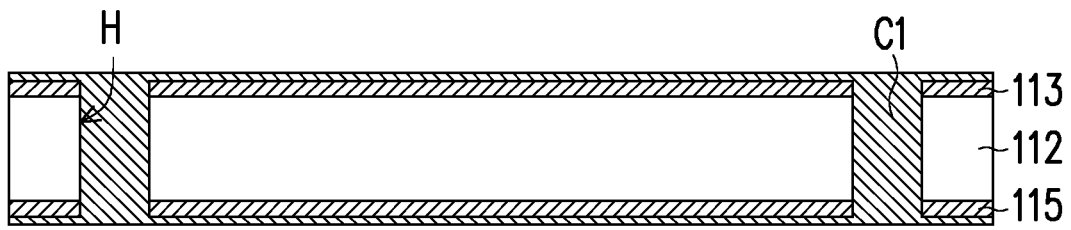

Next, referring to FIG. 2C, a conductive material layer C1 is formed on the first copper foil layer 113 and the second copper foil layer 115, wherein the conductive material layer C1 fills the through holes H and covers the first copper foil layer 113 and the second copper foil layer 115. Herein, the conductive material layer C1 completely covers over the first copper foil layer 113 and the second copper foil layer 115, and the conductive material layer C1 is formed on the first copper foil layer 113 and the second copper foil layer 115 by, for example, electroplating.

Figure 2D:
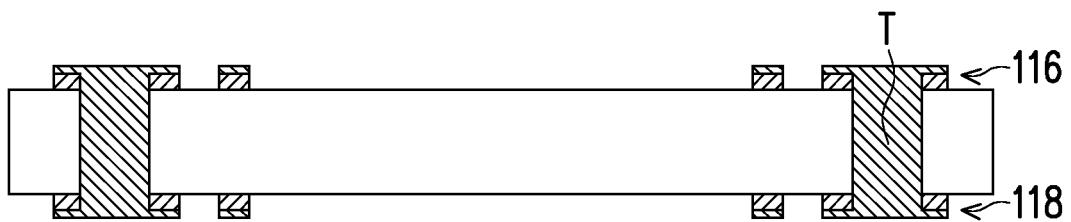

Next, referring to FIG. 2C and FIG. 2D together, the conductive material layer C1, the first copper foil layer 113 and the second copper foil layer 115 are patterned, thereby defining the conductive through hole structures T, the first patterned conductive layer 116 and the second patterned conductive layer 118. Accordingly, in the present embodiment, the first patterned conductive layer 116 is specifically composed of the first copper foil layer 113 and the conductive material layer C1, and the second patterned conductive layer 118 is specifically composed of the second copper foil layer 115 and the conductive material layer C1.

Figure 2E:

Next, referring to FIG. 2E, the opening 114 is formed passing through the dielectric layer 112, thereby completing fabrication of one core layer 110. In brief, the core layer 110 formed in the present embodiment includes the dielectric layer 112, the opening 114, the first patterned conductive layer 116, the second patterned conductive layer 118 and the conductive through hole structures T. The dielectric layer 112 has the upper surface 112a and the lower surface 112b opposite each other, and the opening 114 passes through the dielectric layer 112. The first patterned conductive layer 116 is located on the upper surface 112a, and the second patterned conductive layer 118 is located on the lower surface 112b. The conductive through hole structures T pass through the dielectric layer 112 and connect the first patterned conductive layer 116 with the second patterned conductive layer 118.

Figure 2F:

Next, referring to FIG. 2F, a support S is provided to contact the second patterned conductive layer 118. Herein, the support S is, for example, a glue layer, and is configured to support the structure of the core layer 110. For example, the glue layer may be a tape having adhesion, and may be composed of a polyimide layer having a thickness of 25 μm and an adhesive layer having a thickness of 5 μm. However, the invention is not limited thereto. In other embodiments, the support S may be other suitable types of glue layers.

Figure 2G:
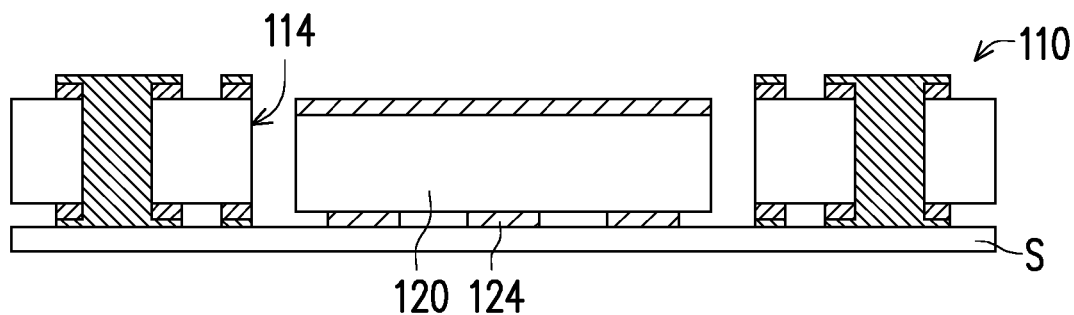

Next, referring to FIG. 2G, the electronic component 120 is disposed inside the opening 114 of the core layer 110. Herein, the electronic component 120 is disposed inside the opening 114 of the core layer 110, and the second electrode pads 124 of the electronic component 120 are located on the support S. That is, the electronic component 120 is supported by the support S. As shown in FIG. 2G, the number of the electronic component 120 is specifically one, and the electronic component 120 is, for example, an active component such as a transistor, or a passive component such as a resistor, a capacitor or an inductor. Of course, in other embodiments not illustrated, the number of the electronic component 120 may be plural, and the plurality of electronic components 120 may be active components, passive components, or a combination of active components and passive components. Moreover, in other embodiments not illustrated, the electronic component 120 may have an electrode pad disposed on only one surface (either the top surface 120a or the bottom surface 120b) thereof, wherein the number of the electrode pad is not limited to one or plural.

Figure 2H:
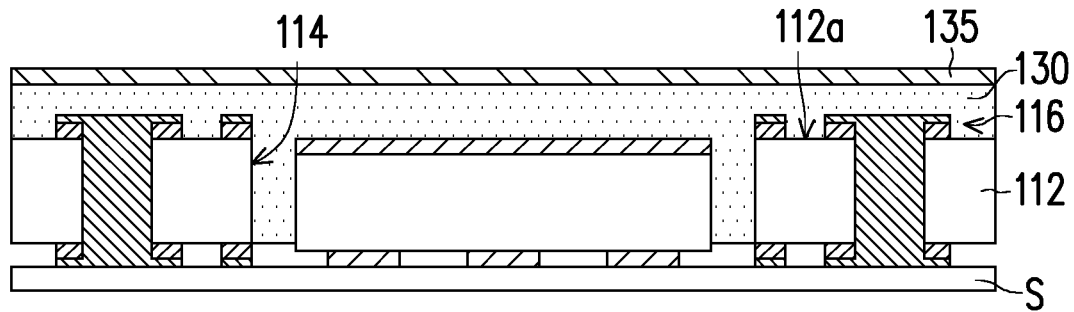

Next, referring to FIG. 2H, the first insulating layer 130 and a first circuit layer 135 located on the first insulating layer 130 are laminated onto the first patterned conductive layer 116, wherein the first insulating layer 130 covers the first patterned conductive layer 116 and the upper surface 112a of the dielectric layer 112 and is filled into the opening 114. Herein, a method of laminating the first insulating layer 130 and the first circuit layer 135 located on the first insulating layer 130 onto the first patterned conductive layer 116 is, for example, a thermal lamination method. Therefore, the first insulating layer 130 is filled into the opening 114 due to the thermal lamination. It should be noted that the depth of the first insulating layer 130 filled into the opening 114 as illustrated in FIG. 2H is only for schematic purposes, and the invention is not limited thereto.

Figure 2I:
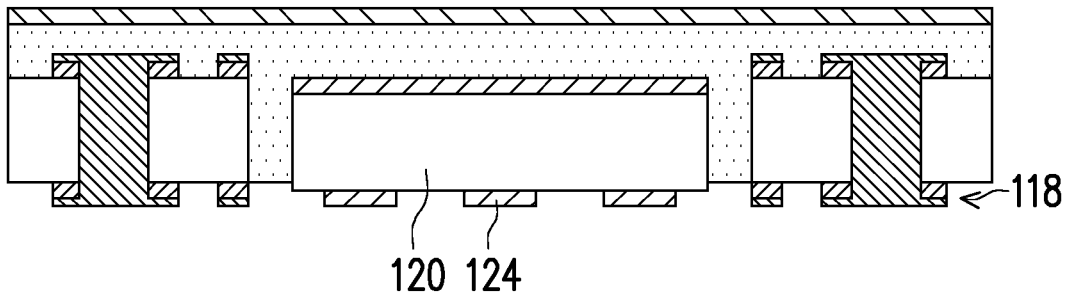

Next, referring to FIG. 2H and FIG. 2I together, the support S is removed to expose the second patterned conductive layer 118 and the second electrode pads 124 of the electronic component 120. Herein, a method of removing the support S is, for example, holding one end of the support S using an automatic equipment, and tearing off the support S by a mechanical force, for example, by stripping or by lift-off. However, the invention is not limited thereto. In other embodiments, the support S may be removed by other suitable means.

Figure 2J:
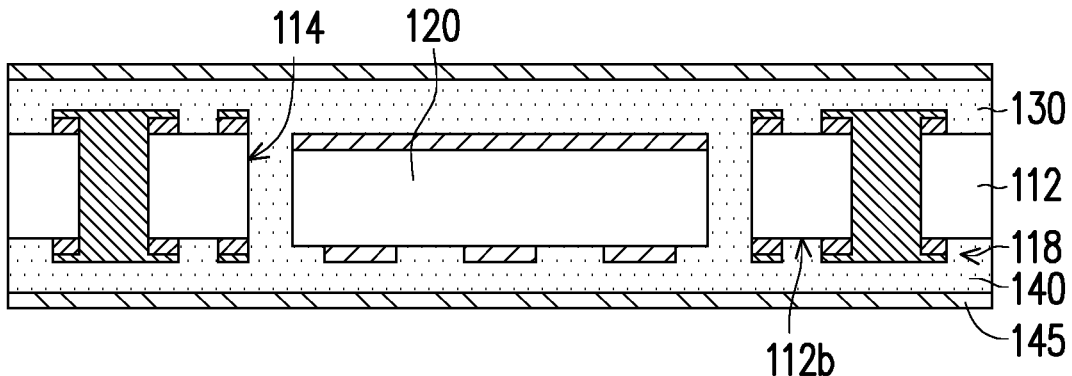

Next, referring to FIG. 2J, the second insulating layer 140 and a second circuit layer 145 located on the second insulating layer 140 are laminated onto the second patterned conductive layer 118, wherein the second insulating layer 140 covers the second patterned conductive layer 118 and the lower surface 112b of the dielectric layer 112 and is filled into the opening 114. Herein, a method of laminating the second insulating layer 140 and the second circuit layer 145 located on the second insulating layer 140 onto the second patterned conductive layer 118 is, for example, a thermal lamination method. Therefore, the second insulating layer 140 is filled into the opening 114 due to the thermal lamination. Particularly, the first insulating layer 130 and the second insulating layer 140 completely fill the opening 114 and completely encapsulate the electronic component 120.

Figure 2K:
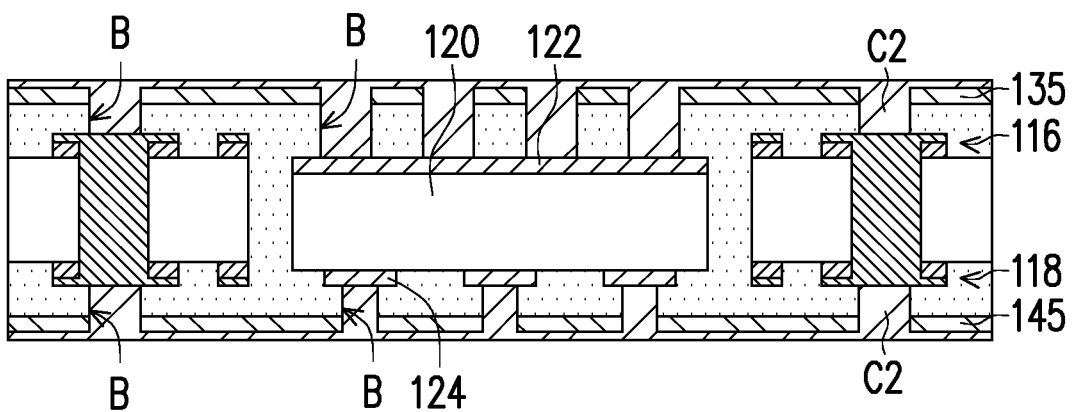

Next, referring to FIG. 2K, a plurality of blind vias B are formed, wherein the blind vias B extend from the first circuit layer 135 to the first patterned conductive layer 116 and the first electrode pad 122 of the electronic component 120, and extend from the second circuit layer 145 to the second patterned conductive layer 118 and the second electrode pads 124 of the electronic component 120. Next, a conductive material layer C2 is formed on the first circuit layer 135 and the second circuit layer 145, wherein the conductive material layer C2 fills the blind vias B and covers the first circuit layer 135 and the second circuit layer 145.

Figure 2L:
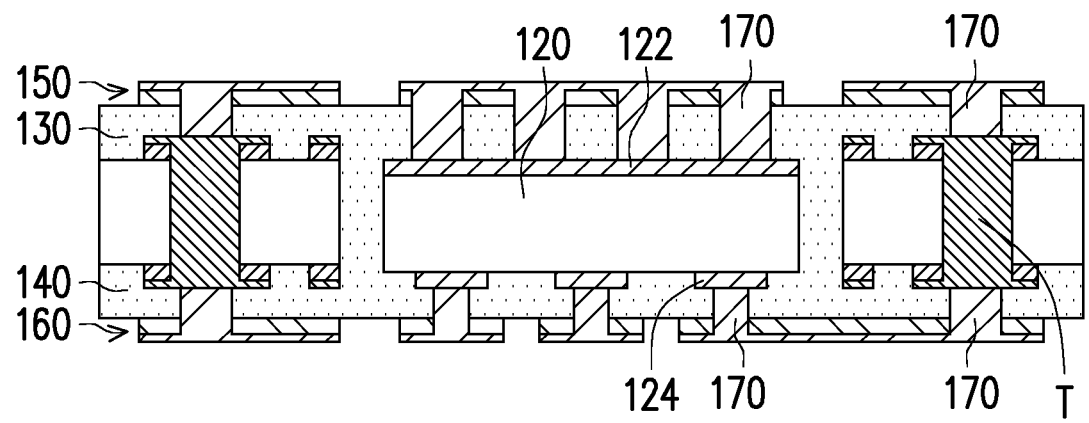

Then, referring to FIG. 2K and FIG. 2L together, the conductive material layer C2, the first circuit layer 135 and the second circuit layer 145 are patterned, thereby forming the conductive blind via structures 170, the third patterned conductive layer 150 and the fourth patterned conductive layer 160. Herein, the third patterned conductive layer 150 is located on the first insulating layer 130, and the third patterned conductive layer 150 is specifically composed of the first circuit layer 135 and the conductive material layer C2. The fourth patterned conductive layer 160 is located on the second insulating layer 140, and the fourth patterned conductive layer 160 is specifically composed of the second circuit layer 145 and the conductive material layer C2. The conductive blind via structures 170 connect the third patterned conductive layer 150 with the conductive through hole structures T, the fourth patterned conductive layer 160 with the conductive through hole structures T, the third patterned conductive layer 150 with the first electrode pad 122 of the electronic component 120, and the fourth patterned conductive layer 160 with the second electrode pads 124 of the electronic component 120. That is, in the present embodiment, by the conductive blind via structures 170, the third patterned conductive layer 150 is structurally and electrically connected with the conductive through hole structures T, the fourth patterned conductive layer 160 is structurally and electrically connected with the conductive through hole structures T, the third patterned conductive layer 150 is structurally and electrically connected with the first electrode pad 122 of the electronic component 120, and the fourth patterned conductive layer 160 is structurally and electrically connected with the second electrode pads 124 of the electronic component 120. The above has illustrated an example in which the component embedded layer 102 is formed by the above manufacturing process.

Figure 2M:
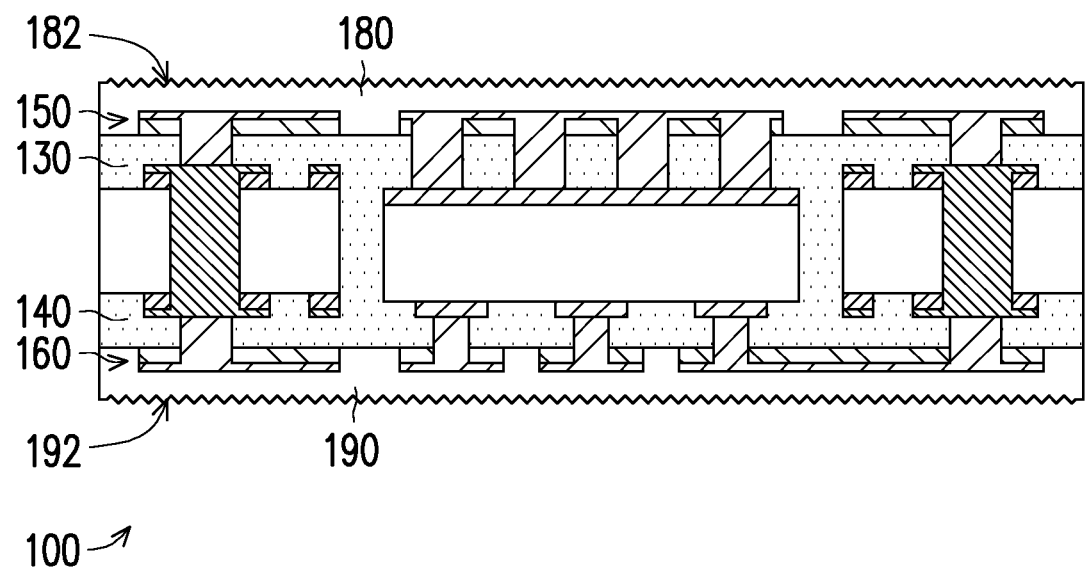

Finally, referring to FIG. 2M, the first protecting layer 180 and the second protecting layer 190 are formed, and the component embedded layer 102 is located between the first protecting layer 180 and the second protecting layer 190, wherein the first protecting layer 180 and the second protecting layer 190 preferably have characteristics such as acid and alkali resistance and washability, and a material of the first protecting layer 180 and the second protecting layer 190 includes, for example but not limited to, polyimide, solder mask, resin coated copper (RCC), prepreg, an ajinomoto build-up film (ABF) material or other suitable materials. Moreover, a method of forming the first protecting layer 180 and the second protecting layer 190 includes a coating method or a lamination method, wherein a material used in the coating method includes, for example, polyimide, solder mask or other suitable materials, and a material used in the lamination method includes, for example, solder mask, RCC, prepreg, an ABF material or other suitable materials. The first protecting layer 180 has the first roughness surface 182 and covers the third patterned conductive layer 150 and a portion of the first insulating layer 130, wherein the roughness of the first roughness surface 182 is, for example, between 1 μm and 5 μm, and the ten-point average roughness (Rz) of the first roughness surface 182 is, for example, between 1 and 5 μm. The second protecting layer 190 has the second roughness surface 192 and covers the fourth patterned conductive layer 160 and a portion of the second insulating layer 140, wherein the roughness of the second roughness surface 192 is, for example, between 1 μm and 5 μm, and the ten-point average roughness (Rz) of the second roughness surface 192 is, for example, between 1 μm and 5 μm. Up to this step, the manufacture of the component embedded package carrier 100 is completed.

In the present embodiment, the first protecting layer 180 covers the third patterned conductive layer 150 and a portion of the first insulating layer 130, and the second protecting layer 190 covers the fourth patterned conductive layer 160 and a portion of the second insulating layer 140. Therefore, the first protecting layer 180 and the second protecting layer 190 effectively protect the third patterned conductive layer 150 and the fourth patterned conductive layer 160. In addition, the first protecting layer 180 has the first roughness surface 182, and the second protecting layer 190 has the second roughness surface 192. Accordingly, when the component embedded package carrier 100 is placed inside another carrier (not illustrated) in a subsequent step, a bonding force between the component embedded package carrier 100 and the another carrier is effectively increased.

In the present embodiment, by laminating the insulating layer twice, i.e., by laminating the first insulating layer 130 and laminating the second insulating layer 140, the electronic component 120 is completely encapsulated, thereby forming the component embedded package carrier 100. Therefore, compared to the prior art in which the electronic component is disposed on the package carrier, the component embedded package carrier 100 of the present embodiment not only has a smaller package thickness, but is also improved in performance by the embedded electronic component 120.

Figure 3:
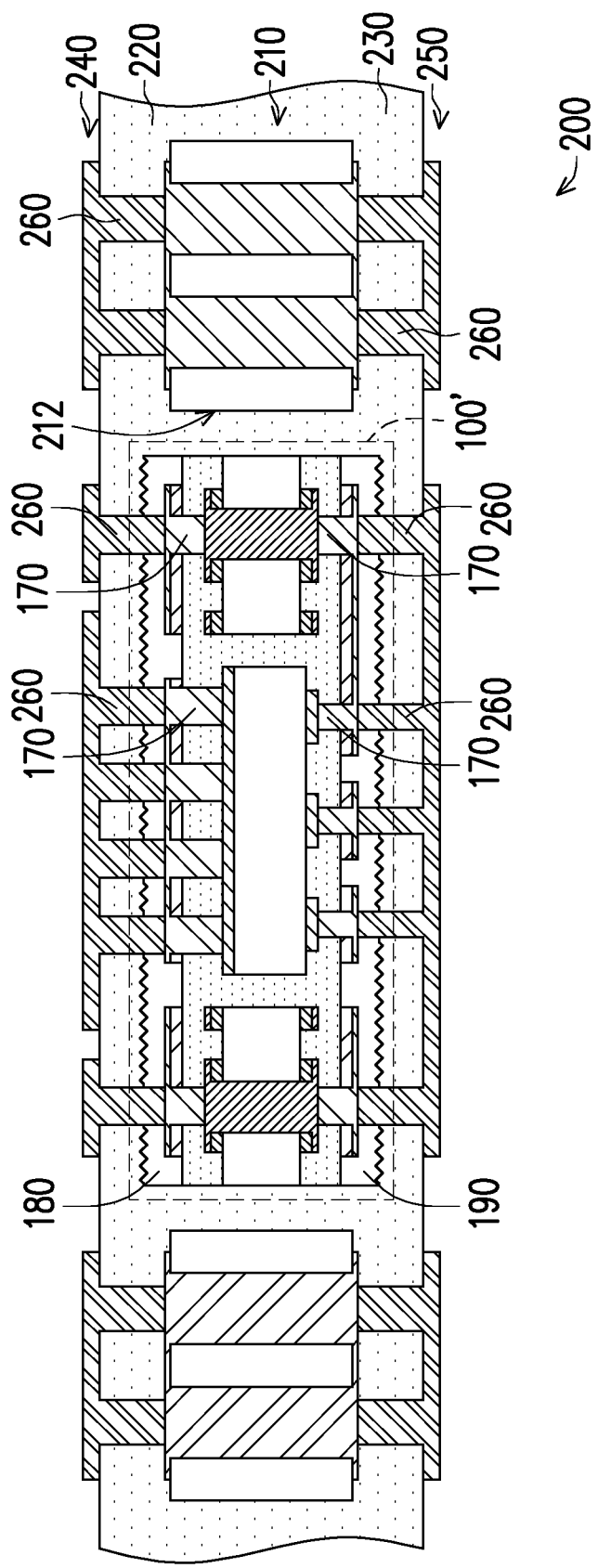
FIG. 3 illustrates a cross-sectional schematic view of an unit embedded package carrier according to another embodiment of the invention.

FIG. 3 illustrates a cross-sectional schematic view of a component embedded package carrier according to another embodiment of the invention. Referring to FIG. 3, a component embedded package carrier 200 of the present embodiment is similar to the component embedded package carrier 100 in FIG. 1, and a difference between them lies in that the component embedded package carrier 100 in FIG. 1 has the electronic component 120 embedded therein, while the component embedded package carrier 200 has a component embedded package unit 100' embedded therein. In detail, the component embedded package carrier 200 of the present embodiment includes the component embedded package unit 100', a carrier 210, a third insulating layer 220, a fourth insulating layer 230, a fifth patterned conductive layer 240, a sixth patterned conductive layer 250 and a plurality of conductive connection structures 260.

Specifically, the structure of the component embedded package unit 100' of the present embodiment may be the same as the structure of the component embedded package carrier 100 in FIG. 1. For example, the component embedded package unit 100' includes the component embedded layer 102, the first protecting layer 180 and the second protecting layer 190. The carrier 210 has a containing opening 212, and the component embedded package unit 100' is disposed inside the containing opening 212. The third insulating layer 220 covers the first protecting layer 180 of the component embedded package unit 100' and the carrier 210 and is filled into the containing opening 212. The fourth insulating layer 230 covers the second protecting layer 190 of the component embedded package unit 100' and the carrier 210 and is filled into the containing opening 212, wherein the third insulating layer 220 and the fourth insulating layer 230 completely fill the containing opening 212 and completely encapsulate the component embedded package unit 100'. The fifth patterned conductive layer 240 is disposed on the third insulating layer 220, and the sixth patterned conductive layer 250 is disposed on the fourth insulating layer 230. The conductive connection structures 260 connect the fifth patterned conductive layer 240 with the conductive blind via structures 170, the sixth patterned conductive layer 250 with the conductive blind via structures 170, the fifth patterned conductive layer 240 with the carrier 210 and the sixth patterned conductive layer 250 with the carrier 210. That is, in the present embodiment, by the conductive connection structures 260, the fifth patterned conductive layer 240 is structurally and electrically connected with the conductive blind via structures 170 of the component embedded package unit 100', the sixth patterned conductive layer 250 is structurally and electrically connected with the conductive blind via structures 170 of the component embedded package unit 100', the fifth patterned conductive layer 240 is structurally and electrically connected with the carrier 210, and the sixth patterned conductive layer 250 is structurally and electrically connected with the carrier 210.

FIG. 4A to FIG. 4E illustrate cross-sectional schematic views of partial steps of a manufacturing method of a component embedded package carrier according to another embodiment of the invention. In the manufacturing process, after the step in FIG. 2M, i.e., after the first protecting layer 180 and the second protecting layer 190 are formed, the component embedded package unit 100' is defined. Next, referring to FIG. 4A, the carrier 210 is provided, wherein the carrier 210 has the containing opening 212. A support S' is provided to contact the carrier 210. Herein, the support S' is, for example, a glue layer, and is configured to support the structure of the carrier 210. For example, the glue layer may be a tape having adhesion, and may be composed of a polyimide layer having a thickness of 25 μm and an adhesive layer having a thickness of 5 μm. However, the invention is not limited thereto. In other embodiments, the support S' may be other suitable types of glue layers.

Figure 4A:
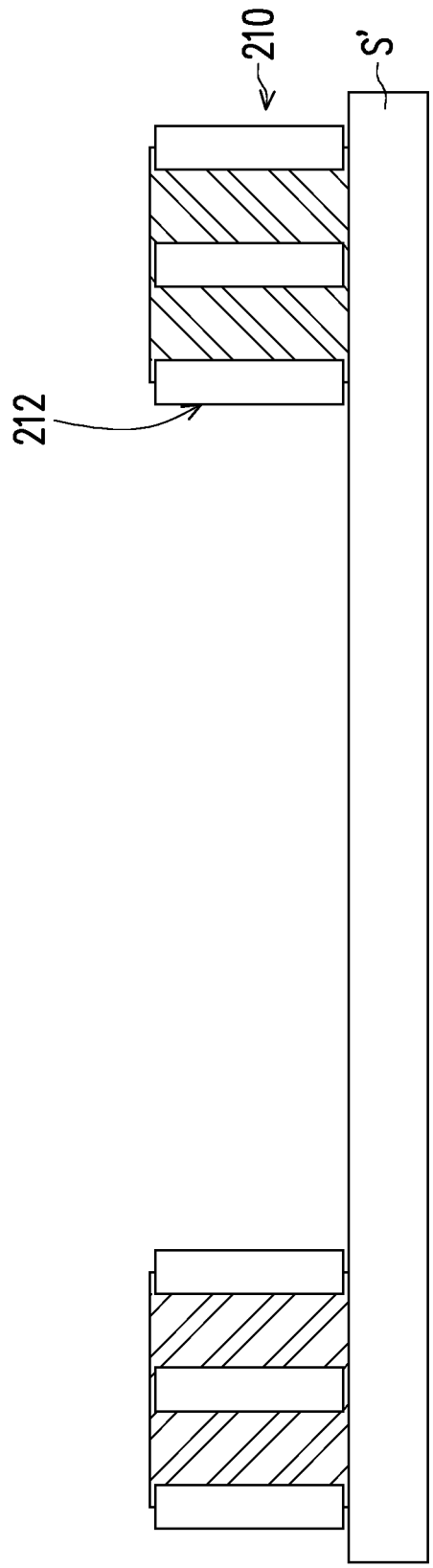
FIG. 4A to FIG. 4E illustrate cross-sectional schematic views of partial steps of a manufacturing method of an unit embedded package carrier according to another embodiment of the invention.
Figure 4B:
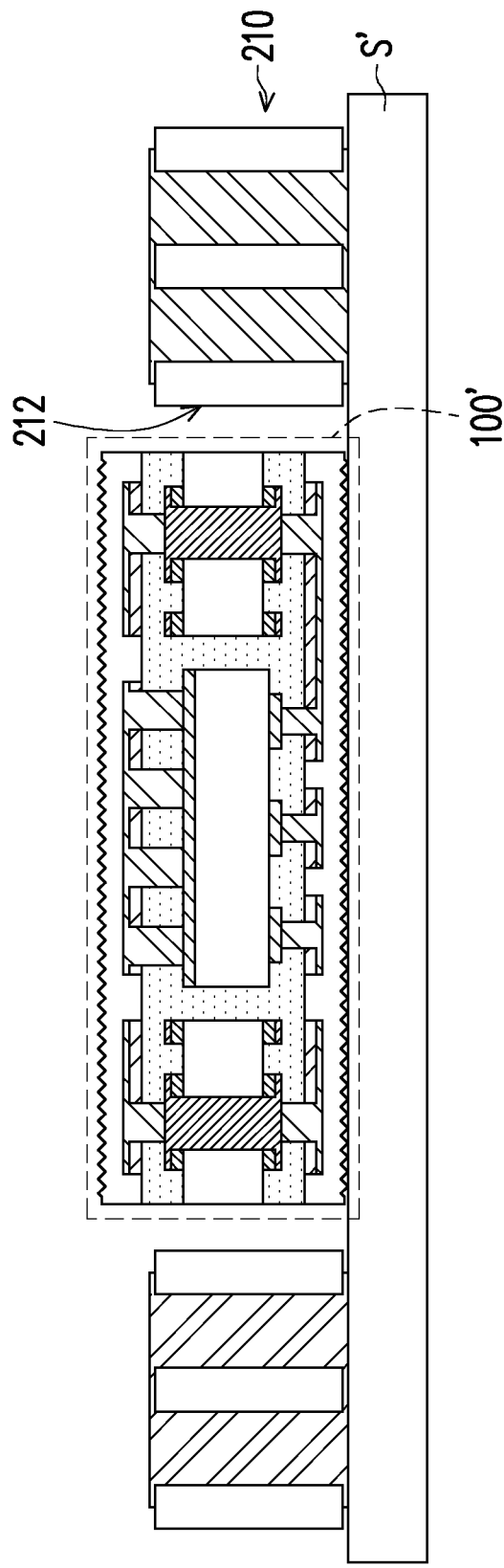
Figure 4C:
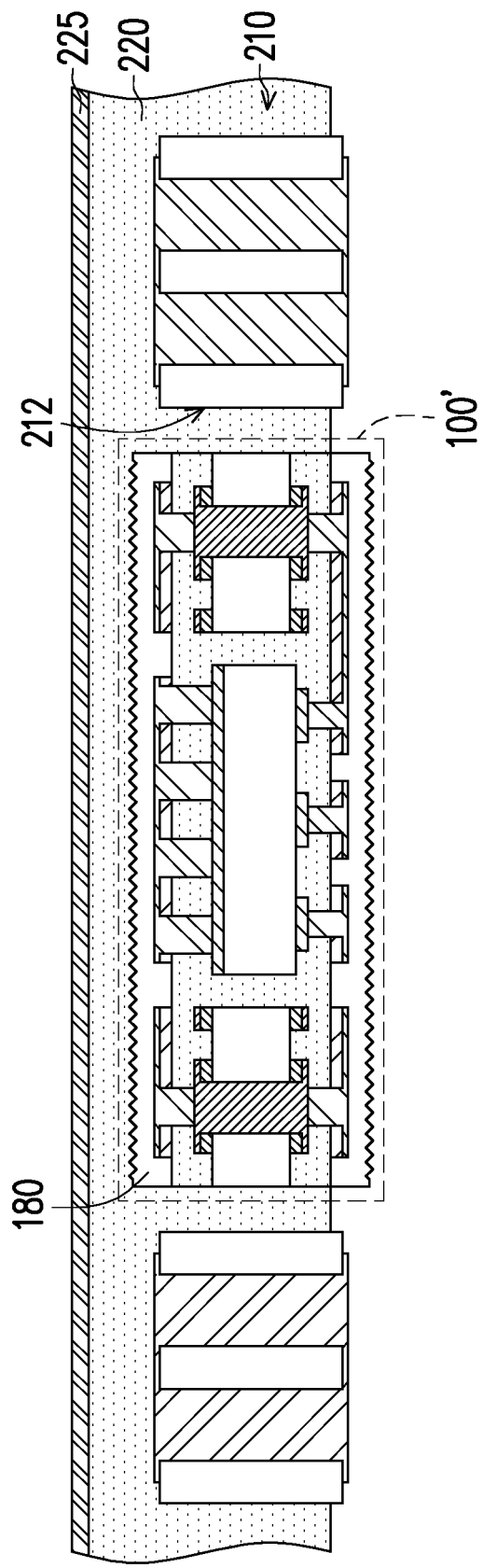

Next, referring to FIG. 4B, the component embedded package unit 100' is disposed inside the containing opening 212 of the carrier 210. That is, the component embedded package unit 100' is supported by the support S'. Next, referring to FIG. 4C, by thermal lamination, the third insulating layer 220 and a third circuit layer 225 located thereon are laminated onto the first protecting layer 180 of the component embedded package unit 100', wherein the third insulating layer 220 covers the first protecting layer 180 and the carrier 210 and is filled into the containing opening 212. Then, the support S' is removed to expose the component embedded package unit 100'. Herein, a method of removing the support S' is, for example, holding one end of the support S' using an automatic equipment, and tearing off the support S' by a mechanical force, for example, by stripping or by lift-off. However, the invention is not limited thereto. In other embodiments, the support S' may be removed by other suitable means.

Figure 4D:
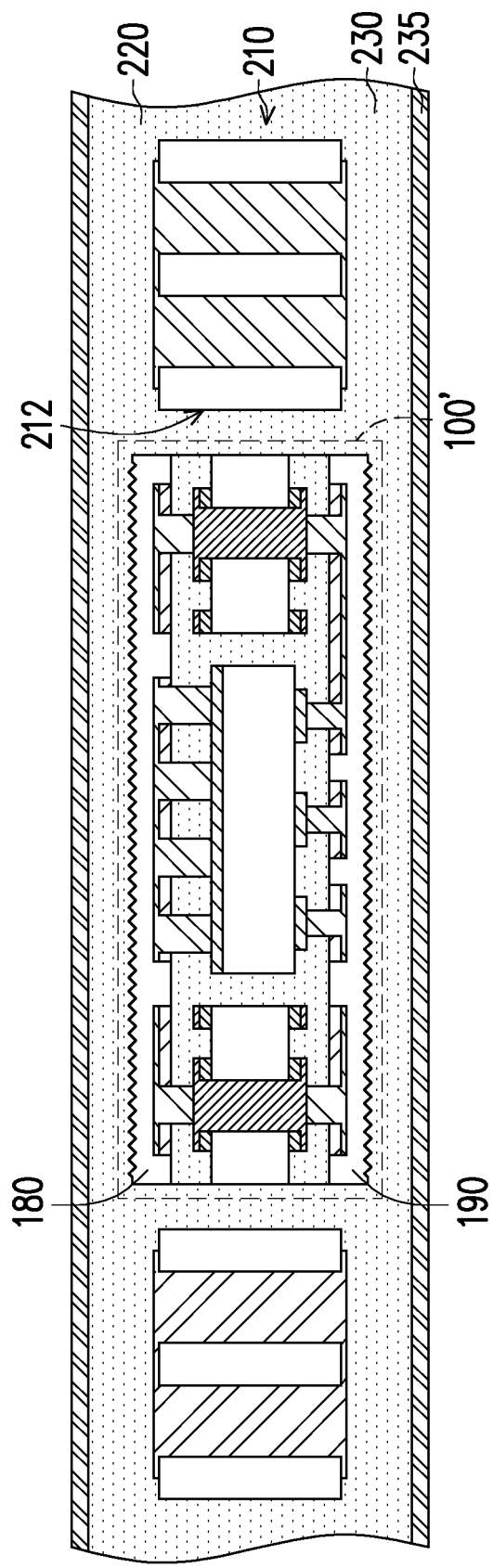
Figure 4E:
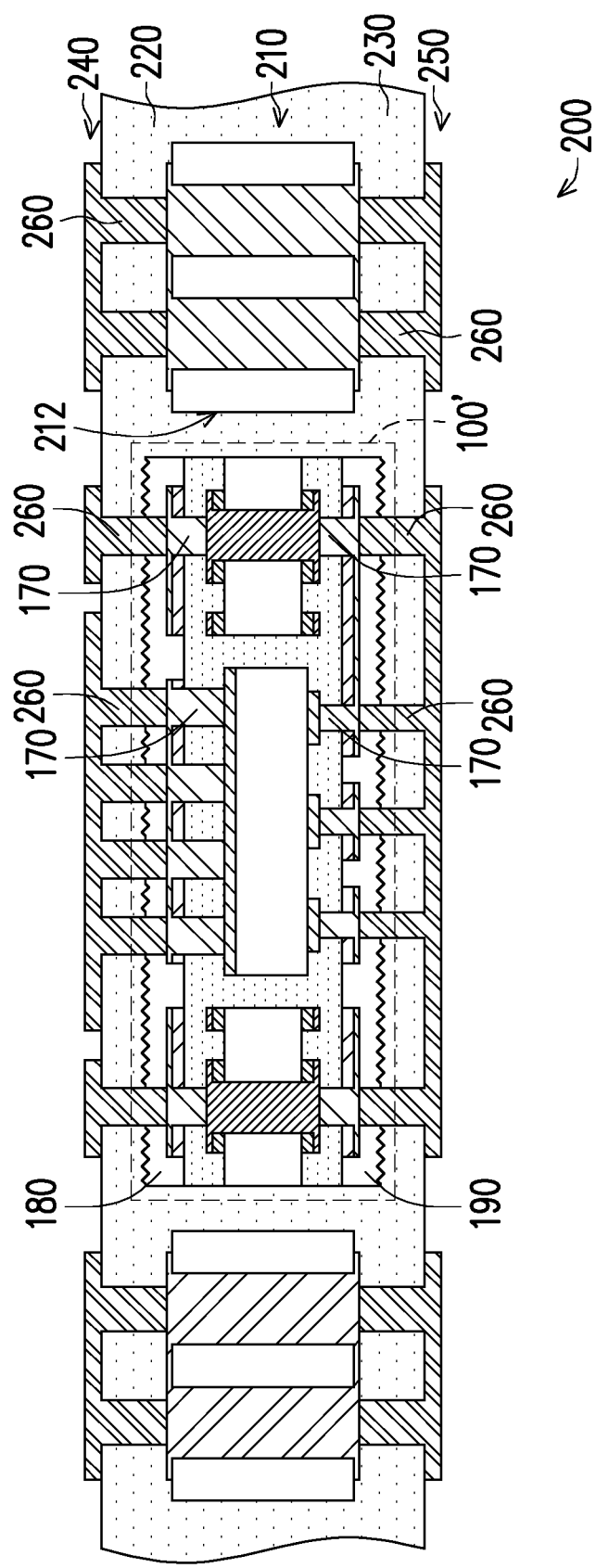

Referring to FIG. 4D, the fourth insulating layer 230 and a fourth circuit layer 235 located thereon are laminated onto the second protecting layer 190, wherein the fourth insulating layer 230 covers the second protecting layer 190 and the carrier 210 and is filled into the containing opening 212. Herein, the third insulating layer 220 and the fourth insulating layer 230 completely encapsulate the component embedded package unit 100' and fill the containing opening 212. Then, referring to FIG. 4E, the conductive connection structures 260, the fifth patterned conductive layer 240 and the sixth patterned conductive layer 250 are formed, wherein details of the formation of the conductive connection structures 260, the fifth patterned conductive layer 240 and the sixth patterned conductive layer 250 may be understood by referring to the aforementioned steps in FIG. 2K and FIG. 2L, and will be omitted herein. The fifth patterned conductive layer 240 is located on the third insulating layer 220, and the sixth patterned conductive layer 250 is located on the fourth insulating layer 230. The conductive connection structures 260 connect the fifth patterned conductive layer 240 with the conductive blind via structures 170, the sixth patterned conductive layer 250 with the conductive blind via structures 170, the fifth patterned conductive layer 240 with the carrier 210 and the sixth patterned conductive layer 250 with the carrier 210. Up to this step, the manufacture of the component embedded package carrier 200 is completed. In brief, the component embedded package carrier 200 of the present embodiment has the component embedded package unit 100' embedded therein, wherein the component embedded package unit 100' has the electronic component 120 embedded therein. Therefore, not only the thickness of the whole component embedded package carrier 200 is effectively reduced, but performance of the component embedded package carrier 200 is effectively improved. In addition, since the first protecting layer 180 and the second protecting layer 190 of the component embedded package unit 100' respectively have the first roughness surface 182 and the second roughness surface 192, the first protecting layer 180 and the second protecting layer 190 have better bonding strength with respect to the third insulating layer 220 and the fourth insulating layer 230.

In summary, the component embedded package carrier of the invention has the electronic component or the component embedded package unit embedded therein. Therefore, the component embedded package carrier not only has a smaller package thickness, but is also improved in performance by the electronic component or the component embedded package unit.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A manufacturing method of a component embedded package carrier, comprising:
    forming a core layer, the core layer comprising a dielectric layer, an opening of the core layer, a first patterned conductive layer, a second patterned conductive layer and a plurality of conductive through hole structures, the dielectric layer having an upper surface and a lower surface opposite each other, the opening passing through the dielectric layer, the first patterned conductive layer being located on the upper surface, the second patterned conductive layer being located on the lower surface, and the conductive through hole structures passing through the dielectric layer and connecting the first patterned conductive layer with the second patterned conductive layer, wherein forming the core layer comprises:
        providing the dielectric layer, a first copper foil layer and a second copper foil layer, the first copper foil layer being disposed on the upper surface of the dielectric layer, and the second copper foil layer being disposed on the lower surface of the dielectric layer;
        forming a plurality of through holes, the through holes passing through the dielectric layer, the first copper foil layer and the second copper foil layer;
        forming a first conductive material layer on the first copper foil layer and the second copper foil layer, wherein the first conductive material layer fills the through holes and entirely covers the first copper foil layer and the second copper foil layer;
        patterning the first conductive material layer, the first copper foil layer and the second copper foil layer, thereby defining the conductive through hole structures, the first patterned conductive layer and the second patterned conductive layer; and
        forming the opening of the core layer, after patterning the first conductive material layer, the first copper foil layer and the second copper foil layer;
    disposing at least one electronic component inside the opening of the core layer;
    laminating a first insulating layer and a first circuit layer located on the first insulating layer onto the first patterned conductive layer, wherein the first insulating layer covers the first patterned conductive layer and the upper surface of the dielectric layer and is filled into the opening of the core layer;
    laminating a second insulating layer and a second circuit layer located on the second insulating layer onto the second patterned conductive layer, wherein the second insulating layer covers the second patterned conductive layer and the lower surface of the dielectric layer and is filled into the opening of the core layer, and the first insulating layer and the second insulating layer completely fill the opening of the core layer and completely encapsulate the electronic component;
    forming a plurality of conductive blind via structures, a third patterned conductive layer and a fourth patterned conductive layer, the third patterned conductive layer being located on the first insulating layer and comprising the first circuit layer, the fourth patterned conductive layer being located on the second insulating layer and comprising the second circuit layer, and the conductive blind via structures connecting the third patterned conductive layer with the conductive through hole structures, the fourth patterned conductive layer with the conductive through hole structures, the third patterned conductive layer with the electronic component and the fourth patterned conductive layer with the electronic component, wherein forming the conductive blind via structures, the third patterned conductive layer and the fourth patterned conductive layer comprises:

forming a plurality of blind vias, the blind vias extending from the first circuit layer to the first patterned conductive layer and the electronic component and extending from the second circuit layer to the second patterned conductive layer and the electronic component;

forming a second conductive material layer on the first circuit layer and the second circuit layer, wherein the second conductive material layer fills the blind vias and entirely covers the first circuit layer and the second circuit layer; and patterning the second conductive material layer, the first circuit layer and the second circuit layer, thereby defining the conductive blind via structures, the third patterned conductive layer and the fourth patterned conductive layer; and forming a first protecting layer and a second protecting layer, the first protecting layer having a first roughness surface and covering the third patterned conductive layer and a portion of the first insulating layer, and the second protecting layer having a second roughness surface and covering the fourth patterned conductive layer and a portion of the second insulating layer.

2. The manufacturing method of a component embedded package carrier as recited in claim 1, further comprising:
providing a support to contact the second patterned conductive layer, after forming the core layer and before disposing the electronic component; and
removing the support to expose the second patterned conductive layer, after laminating the first insulating layer and the first circuit layer located on the first insulating layer onto the first patterned conductive layer and before laminating the second insulating layer and the second circuit layer located on the second insulating layer onto the second patterned conductive layer.

3. The manufacturing method of a component embedded package carrier as recited in claim 1, wherein roughness of the first roughness surface is between 1 μm and 5 μm.

4. The manufacturing method of a component embedded package carrier as recited in claim 1, wherein roughness of the second roughness surface is between 1 μm and 5 μm.

5. The manufacturing method of a component embedded package carrier as recited in claim 1, wherein the electronic component comprises an active component or a passive component.

* * * * *